United States Patent
Doukai (10) Patent No.: US 8,139,201 B2
(45) Date of Patent: Mar. 20, 2012

(54) EXPOSURE APPARATUS AND METHOD OF MANUFACTURING DEVICE

(75) Inventor: Kouji Doukai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 505 days.

(21) Appl. No.: 12/390,336

(22) Filed: Feb. 20, 2009

(65) Prior Publication Data

US 2009/0219502 A1 Sep. 3, 2009

(30) Foreign Application Priority Data

Feb. 28, 2008 (JP) ................. 2008-048824

(51) Int. Cl.
G03B 27/74 (2006.01)

(52) U.S. Cl. .......................................... 355/68; 355/69

(58) Field of Classification Search ................ 355/68, 355/69
See application file for complete search history.

(56) References Cited

U.S. PATENT DOCUMENTS

| | | | | |
|---|---|---|---|---|
| 5,475,491 A | * | 12/1995 | Shiozawa | 356/394 |
| 5,638,207 A | * | 6/1997 | Fukuzawa et al. | 359/375 |
| 6,522,390 B2 | * | 2/2003 | Suzuki et al. | 355/53 |
| 6,727,982 B2 | * | 4/2004 | Kawashima et al. | 355/70 |
| 6,803,991 B2 | * | 10/2004 | Mori | 355/53 |
| 7,251,029 B2 | | 7/2007 | Kishikawa | |
| 7,408,616 B2 | * | 8/2008 | Gruner et al. | 355/53 |
| 7,508,493 B2 | * | 3/2009 | Takeuchi et al. | 355/71 |
| 2004/0114121 A1 | * | 6/2004 | Nishi et al. | 355/67 |

FOREIGN PATENT DOCUMENTS

| | | |
|---|---|---|
| JP | 2785157 B | 8/1998 |
| JP | 2002-198281 A | 7/2002 |
| JP | 2004-037137 A | 2/2004 |

* cited by examiner

*Primary Examiner* — Edward Glick
*Assistant Examiner* — Thomas R Artman
(74) *Attorney, Agent, or Firm* — Canon USA Inc IP Division (57) ABSTRACT

An exposure apparatus includes a light dividing surface which reflects a certain component of the light beam bifurcated by an illumination optical system, and transmits the remaining component of the light beam, a first photoelectric conversion element which detects the light beam transmitted through the light dividing surface, a second photoelectric conversion element which detects the light beam reflected by the light dividing surface, and a controller which controls the light beam which becomes incident on the substrate, using the outputs from the first photoelectric conversion element and the second photoelectric conversion element while the light emitted by a light source is in a first polarization state, and the outputs from the first photoelectric conversion element and the second photoelectric conversion element while the light emitted by the light source is in a second polarization state.

2 Claims, 8 Drawing Sheets

EXPOSURE APPARATUS AND METHOD OF MANUFACTURING DEVICE

BACKGROUND OF THE INVENTION

1. Field of the Invention

The present invention relates to an exposure apparatus and a method of manufacturing a device.

2. Description of the Related Art

Semiconductor devices such as an IC and LSI, liquid crystal devices, image sensing devices such as a CCD, and devices such as a magnetic head are manufactured using photolithography. At this time, the pattern of a reticle (to be also referred to as an original or mask hereinafter) is projected onto a photosensitive substrate (to be also simply referred to as a substrate hereinafter) such as a semiconductor wafer at a predetermined magnification, thereby exposing the photosensitive substrate. Along with the recent increase in the packing density of integrated circuits (devices) such as an IC and LSI, an exposure apparatus which can precisely form a micropattern with a minimum line width as small as several tens of nanometers on the wafer has come to be used.

In general, an appropriate exposure amount is determined for the photosensitive agent applied on the wafer. To attain this amount, techniques of controlling the exposure amount to expose the wafer with a predetermined exposure amount have conventionally been proposed. To control the exposure amount, an optical member such as a half mirror is normally inserted in the optical path of the exposure light. A detection unit for monitoring the exposure amount, such as an optical sensor, receives one of light reflected by the optical member or that transmitted through the optical member, thereby detecting the exposure amount. In accordance with the signal output from the detection unit, the exposure amount is controlled by, for example, the opening/closing of a shutter inserted in the optical path of the exposure light, the emission/stop of the laser, or the control of energy set for the laser. Japanese Patent No. 2785157 discloses details of such a technique.

Along with the recent advance in micropatterning of semiconductor devices, a polarization illumination system has come to be used. In this system, the wafer is exposed with P- or S-polarized exposure light or exposure light having P- and S-polarized light components at an arbitrarily set ratio. When the wafer is exposed using the polarization illumination system, the exposure amount is controlled using the detection unit, as mentioned above, as well.

To control the exposure amount so as to obtain an optimum exposure amount on the wafer surface, a method is available which inserts an optical member such as a half mirror in the optical path of the exposure light, and detects the exposure light divided via the optical member by a detection unit for monitoring the exposure amount, such as an optical sensor, thereby controlling the exposure amount. The optical member generally has different reflectances and transmittances with respect to the P- and S-polarized light components of the exposure light. Moreover, depending on the polarization characteristic of an optical member inserted in the optical path up to the wafer surface, the ratio between the P- and S-polarized light components of the exposure light divided by the optical member differs between the light-receiving surface of a detection unit such as an optical sensor which measures the exposure amount, and the wafer surface irradiated with the exposure light. Especially when an optical member inserted in the optical path up to the light-receiving surface of the detection unit such as an optical sensor is different in property from that inserted in the optical path up to the wafer surface, the ratio between the polarized light components may largely differ between the light-receiving surface and the wafer surface.

In this manner, when the polarization state of a laser serving as the light source changes over time or when the polarization characteristics of constituent optical members change, the ratio between the amount of light which becomes incident on the detection unit such as an optical sensor and the exposure amount on the wafer surface fluctuates. Therefore, the value detected by the detection unit is insufficient to precisely monitor the amount of exposure light which becomes incident on the wafer surface.

In a polarization illumination system of exposing the wafer with P- or S-polarized exposure light or exposure light having P- and S-polarized light components at an arbitrarily set ratio, the ratio between the amount of light which becomes incident on the detection unit such as an optical sensor and the exposure amount on the wafer surface fluctuates more largely than that in the random polarization illumination system. This makes it more difficult to precisely monitor the exposure amount.

Conventionally, the exposure light divided by a half mirror serving as a first light beam dividing unit is further divided using a second light beam dividing unit for polarization division, such as a polarizing beam splitter or Rochon prism, and the exposure amount is measured and controlled by taking account of the polarized light components of the exposure light. Japanese Patent Laid-Open Nos. 2002-198281 and 2004-37137 discloses details of such techniques.

A polarizing beam splitter used herein must be fabricated by taking account of conditions such as the transmittances and reflectances of the P- and S-polarized light components, assuming various polarization states and various illumination conditions such as annular illumination, dipole illumination, and quadrupole illumination. For this reason, the polarizing beam splitter used herein is more expensive than a general-purpose polarizing beam splitter. A Rochon prism can divide the P- and S-polarized light components at a good transmittance ratio, thereby controlling the exposure amount. However, to obtain a good transmittance ratio between the P- and S-polarized light components the Rochon prism requires an accommodation space larger than that for the polarizing beam splitter. Furthermore, there is a limitation of the incident angle of a light beam with respect to the Rochon prism, so the degree of freedom of its arrangement is low.

SUMMARY OF THE INVENTION

It is an object of the present invention to provide an exposure apparatus capable of accurately controlling a light beam which becomes incident on a substrate using a low-cost, compact detector, free from the influence of any changes in the polarization state and illumination state of exposure light.

According to the present invention, there is provided an exposure apparatus including an illumination optical system which illuminates an original with light emitted by a light source, and a projection optical system which projects a pattern image of the original illuminated by the illumination optical system onto a substrate, the apparatus comprises a light dividing surface which reflects a certain component of the light beam bifurcated by the illumination optical system, and transmits the remaining component of the light beam, a first photoelectric conversion element which detects the light beam transmitted through the light dividing surface, a second photoelectric conversion element which detects the light beam reflected by the light dividing surface, and a controller which controls the light beam which becomes incident on the substrate, using the outputs from the first photoelectric conversion element and the second photoelectric conversion element while the light emitted by the light source is in a first polarization state, and the outputs from the first photoelectric conversion element and the second photoelectric conversion element while the light emitted by the light source is in a second polarization state different from the first polarization state.

According to the present invention, it is possible to provide an exposure apparatus capable of accurately controlling a light beam which becomes incident on a substrate using a low-cost, compact detector, free from the influence of any changes in the polarization state and illumination state of exposure light.

Further features of the present invention will become apparent from the following description of exemplary embodiments with reference to the attached drawings.

DESCRIPTION OF THE EMBODIMENTS

An exposure apparatus according to embodiments of the present invention will be described below with reference to the accompanying drawings. The same reference numerals denote the same members throughout the drawings, and a repetitive description thereof will not be given. In the following description, an original, mask, and reticle are generally referred to as a "reticle", and a substrate and wafer are generally referred to as a "wafer".

First Embodiment

Figure 1:
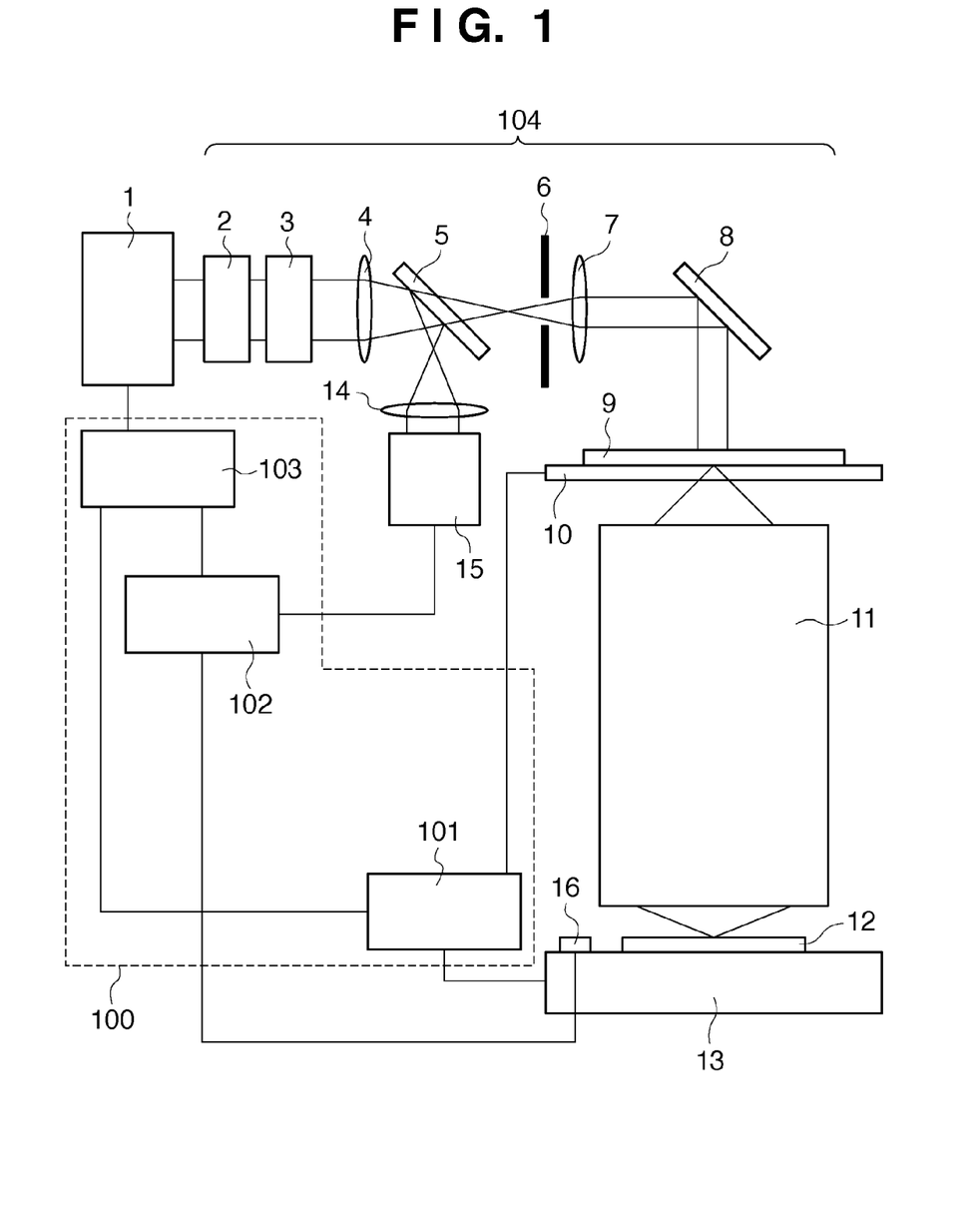
FIG. 1 is a view showing the schematic arrangement of an exposure apparatus.

FIG. 1 is a schematic view showing the arrangement of a scanning projection exposure apparatus according to the first embodiment of the present invention. This apparatus is used to manufacture semiconductor devices such as an IC and LSI, liquid crystal devices, image sensing devices such as a CCD, and devices such as a magnetic head. The projection exposure apparatus need not always be of the scanning type.

Referring to FIG. 1, light emitted by a light source 1 which radiates continuous-wave light or pulse light, such as an excimer laser, is shaped into a desired shape by a beam shaping optical system 2, and enters an optical integrator 3 such as a fly-eye lens.

Although this embodiment will exemplify a case in which a pulse laser is used as the light source 1, the present invention is also applicable to a case in which a continuous-wave laser is used.

The optical integrator 3 is formed by two-dimensionally arraying a plurality of microlenses. A plurality of secondary light sources are formed near the exit surface of the optical integrator 3. The formed secondary light sources Kohler-illuminate a masking blade 6 (movable slit) by a condenser lens 4 via a first light beam dividing unit 5 including a half mirror. The light beam which illuminates the masking blade 6 illuminates a reticle 9, chucked by a reticle stage 10, via an imaging lens 7 and mirror 8. The masking blade 6 and reticle 9 are set to hold a conjugate relationship by the imaging lens 7 and mirror 8. The shape and size of the illumination region on the reticle 9 is defined by the opening shape of the masking blade 6. A circuit pattern necessary to manufacture a device is drawn on the reticle 9. The light beam transmitted through the reticle 9 propagates through a projection optical system 11, and forms a reduced image of the circuit pattern on a wafer 12 which is chucked and supported on a movable wafer stage (substrate stage) 13. A scan controller 101 controls, for example, the scanning directions and scanning speeds of the reticle stage 10 and wafer stage 13.

A detection unit 15 is a photodetector for constantly monitoring the amount of light which exposes the wafer 12. The detection unit 15 constantly monitors a certain component of the laser beam, bifurcated by the first light beam dividing unit 5, via a lens 14. The detection unit 15 is arranged on the exposure target surface of the wafer 12, at a position optically conjugate to a third photoelectric conversion element 16, or its vicinity. The light amounts detected by the detection unit 15 and third photoelectric conversion element 16 are fed back to the light source 1 as its emission intensity. Based on the fed-back information, the light source 1 is controlled by a controller 100 including the scan controller 101, a calculation unit 102, and a light source controller 103.

The third photoelectric conversion element 16 is arranged on the wafer stage 13 to be nearly flush with the wafer 12, and is used to detect the light amount and light amount distribution on the image plane of the projection optical system 11. Normally, the sensitivity of the detection unit 15 is calibrated using the third photoelectric conversion element 16 having its sensitivity calibrated. This is because the transmittances of an illumination optical system 104 and the projection optical system 11 change only slightly. This makes it necessary to calibrate the detection unit 15 used during exposure with reference to the illuminance on the image plane of the projection optical system 11.

A method of controlling the exposure amount when the polarization state of a laser serving as the light source 1 changes over time or when the polarization characteristics of constituent optical members change will be explained. When a change in the polarization state of the exposure light, if any, is not taken into consideration, the ratio between the amount of light which becomes incident on the detection unit 15 such as an optical sensor and the exposure amount on the exposure target surface of the wafer 12 changes largely, which may lead to unnecessary adjustment of the exposure amount. This makes it impossible to expose the wafer with an appropriate exposure amount. For example, as the states of the P- and S-polarized light components of the exposure light change, the amounts of transmission and reflection of the light beam by the first light beam dividing unit 5 also change. At this time, the amount of light which becomes incident on the detection unit 15 decreases. As the amount of light which becomes incident on the exposure target surface of the wafer 12 increases in order to control the exposure amount based on the output result obtained by the detection unit 15, the exposure amount on the exposure target surface of the wafer 12 becomes larger than an appropriate value. This makes it impossible to appropriately control the exposure amount on the exposure target surface. The exposure amount can be appropriately controlled by deriving a coefficient to calculate the exposure light amount or the degree of polarization of the P- or S-polarized light component of the exposure light based on the measurement result obtained by the detection unit 15 by taking account of a change in polarization of the exposure light. Note that the degree of polarization of the P-polarized light component represents the ratio of the amount of P-polarized light component contained in the exposure light which exposes the wafer 12 to the overall exposure light amount. Likewise, the degree of polarization of the S-polarized light component represents the ratio of the amount of S-polarized light component contained in the exposure light which exposes the wafer 12 to the overall exposure light amount. For example, the degree of polarization of the P-polarized light component is represented by a value obtained by dividing the light intensity of the P-polarized light component by the sum of the light intensities of the P- and S-polarized light components.

Figure 2:
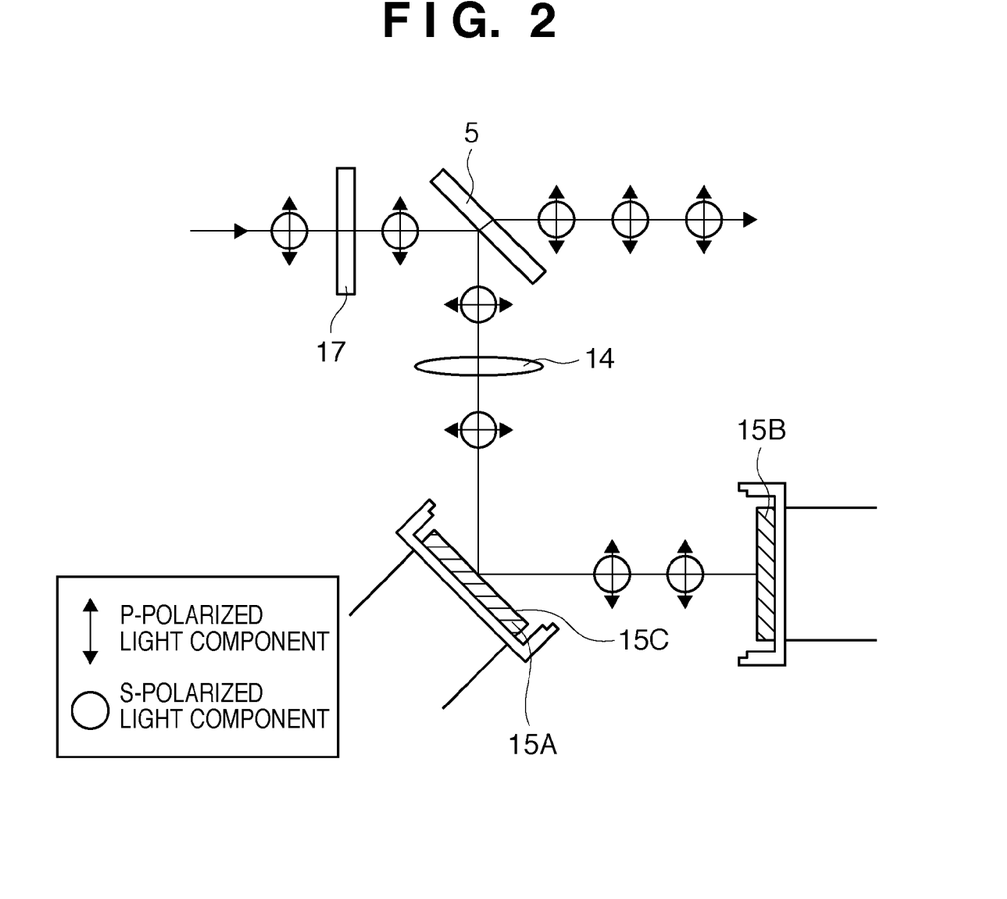
FIG. 2 is a view showing methods of controlling the exposure amount and the degrees of polarization of P- and S-polarized light components using a first photoelectric conversion element and second photoelectric conversion element according to the first embodiment.

A method of calculating the exposure light amount or the degrees of polarization of the P- and S-polarized light components of the exposure light will be explained. FIG. 2 is a view showing details of the detection unit 15. A light beam containing a P-polarized light component (whose polarization direction is the in-plane direction on the paper surface) and an S-polarized light component (whose polarization direction is a direction perpendicular to the paper surface) is bifurcated by the first light beam dividing unit 5, and received by a first photoelectric conversion element 15A via the lens 14. The light reflected by a light dividing surface 15C corresponding to the surface of a member of the first photoelectric conversion element 15A, which is set on the side of the illumination optical system 104, is received by a second photoelectric conversion element 15B. For example, assume that the incident angle of the light beam with respect to the light dividing surface 15C of the first photoelectric conversion element 15A is 45°, as in the arrangement shown in FIG. 2. In this case, about 90% of the P-polarized light component and about 80% of the S-polarized light component are received and detected by the first photoelectric conversion element 15A. About 10% of the P-polarized light component and about 20% of the S-polarized light component are reflected by the light dividing surface 15C of the first photoelectric conversion element 15A, and detected by the second photoelectric conversion element 15B. A coefficient to calculate the exposure light amount or the degree of polarization of the P- or S-polarized light component of the exposure light is derived using the fact that the amount of incident light beam differs between the first photoelectric conversion element 15A and the second photoelectric conversion element 15B. The above-mentioned values are merely one example because the transmittance and reflectance of the light dividing surface 15C of the first photoelectric conversion element 15A change depending on the type of photoelectric conversion element used.

Coefficients A and B to calculate the exposure light amount will be explained. Let SAout and SBout be the outputs from the first photoelectric conversion element 15A and second photoelectric conversion element 15B, respectively. The sensitivity of each photoelectric conversion element is desirably calibrated in advance. Then, using the outputs SAout and SBout, an exposure amount SWout on the exposure target surface of the wafer 12 is given by:

$$SWout = A \times SAout + B \times SBout \quad (1)$$

where A and B are coefficients which are uniquely set for various illumination states, and serve to correct a change in the polarization state of the exposure light.

The use of equation (1) makes it possible to derive the exposure amount on the exposure target surface of the wafer 12, thus controlling the exposure amount free from the influence of any fluctuation in the polarization state. Also, the exposure apparatus is configured to be able to easily calibrate the coefficients A and B, thus coping with fluctuations in the characteristics of optical members themselves.

The outputs from the first photoelectric conversion element 15A, second photoelectric conversion element 15B, and third photoelectric conversion element 16 are those of, for example, the light amount per unit time on the imaging plane of the projection optical system 11, or the light amount per pulse or the integrated light amount per predetermined pulse number when the light source 1 is a pulse light source.

A method of determining the coefficients A and B used to obtain the exposure amount SWout will be explained. To set the polarization state of the exposure light, the illumination optical system 104 is driven. A wave plate 17 (for example, a λ/2 plate) is inserted in the optical path of the exposure light before division by the first light beam dividing unit 5, and the exposure light is measured by the first photoelectric conversion element 15A, second photoelectric conversion element 15B, and third photoelectric conversion element 16. A state in which the wave plate 17 is set so as to implement a polarization state in which the wafer is exposed is defined as a first polarization state. The outputs from the respective photoelectric conversion devices in the first polarization state satisfy a relation:

$$A \times SAout\_base + B \times SBout\_base = SWout\_base \quad (2)$$

where SAout_base, SBout_base, and SWout_base are the outputs from the first photoelectric conversion element 15A, second photoelectric conversion element 15B, and third photoelectric conversion element 16, respectively, in the first polarization state.

The wave plate 17 is rotated to change the polarized light components of the exposure light. This state is defined as a second polarization state. The first photoelectric conversion element 15A, second photoelectric conversion element 15B, and third photoelectric conversion element 16 measure the exposure light in the second polarization state. To change the polarized light components of the exposure light, the polarization state of the light source 1 may be changed instead of rotating the wave plate 17. The outputs from the respective photoelectric conversion elements in the second polarization state satisfy a relation:

$$A \times SAout\_rot + B \times SBout\_rot = SWout\_rot \quad (3)$$

where SAout_rot, SBout_rot, and SWout_rot are the outputs from the first photoelectric conversion element 15A, second photoelectric conversion element 15B, and third photoelectric conversion element 16, respectively, in the second polarization state, and A and B are coefficients which satisfy equations (1) and (2) in the first and second polarization states, respectively.

The exposure amount SWout to control the exposure amount may be derived periodically or while change in the polarization state or illumination state of the exposure light has no adverse influence on the throughput, for example, during apparatus maintenance.

The detection unit 15, first photoelectric conversion element 15A, second photoelectric conversion element 15B, and third photoelectric conversion element 16 receive the light beams and detect the light amounts.

Coefficients C and D to calculate the degree of polarization of the P-polarized light component of the exposure light, and coefficients E and F to calculate the degree of polarization of the S-polarized light component of the exposure light will be explained. Let SAout and SBout be the outputs from the first photoelectric conversion element 15A and second photoelectric conversion element 15B, respectively. The sensitivity of each photoelectric conversion element is desirably calibrated in advance. Then, using the outputs SAout and SBout, degrees of polarization Pout and Sout of the P- and S-polarized light components, respectively, on the exposure target surface of the wafer 12 are given by:

$$C \times SAout + D \times SBout = Pout \quad (4)$$

$$E \times SAout + F \times SBout = Sout \quad (5)$$

where C, D, E, and F are coefficients which are uniquely set for various illumination states, and serve to correct a change in the polarization state of the exposure light.

The use of equations (4) and (5) makes it possible to derive the degrees of polarization of the P- and S-polarized light components on the exposure target surface of the wafer 12, thus measuring and controlling the degrees of polarization of the P- and S-polarized light components free from the influence of any fluctuation in the polarization state. Also, the exposure apparatus is configured to be able to easily calibrate the coefficients C, D, E, and F, thus coping with fluctuations in the characteristics of optical members themselves.

The outputs from the first photoelectric conversion element 15A, second photoelectric conversion element 15B, and third photoelectric conversion element 16 are those of, for example, the light amount per unit time on the imaging plane of the projection optical system 11, or the light amount per pulse or the integrated light amount per predetermined pulse number when the light source 1 is a pulse light source.

A method of determining the coefficients C and D used to obtain the degree of polarization Pout of the P-polarized light component will be explained. To set the polarization state of the exposure light, the illumination optical system 104 is driven. A wave plate 17 (for example, a λ/2 plate) is inserted in the optical path of the exposure light before division by the first light beam dividing unit 5, and the exposure light is measured by the first photoelectric conversion element 15A, second photoelectric conversion element 15B. A state in which the wave plate 17 is set so as to implement a polarization state in which the wafer is exposed is defined as a first polarization state. A degree of polarization Pout_base of the P-polarized light component of the exposure light in the first polarization state is given by:

$$C \times SAout\_base + D \times SBout\_base = Pout\_base \quad (6)$$

where SAout_base and SBout_base are the outputs from the first photoelectric conversion element 15A and second photoelectric conversion element 15B, respectively, in the first polarization state.

The wave plate 17 is rotated to change the polarized light components of the exposure light. This state is defined as a second polarization state. The first photoelectric conversion element 15A and second photoelectric conversion element 15B measure the exposure light in the second polarization state. To change the polarized light components of the exposure light, the polarization state of the light source 1 may be changed instead of rotating the wave plate 17. A degree of polarization Pout_rot of the P-polarized light component of the exposure light in the second polarization state is given by:

$$C \times SAout\_rot + D \times SBout\_rot = Pout\_rot \quad (7)$$

where SAout_rot and SBout_rot are the measurement values obtained by the first photoelectric conversion element 15A and second photoelectric conversion element 15B, respectively, in the second polarization state, Pout_base and Pout_rot are the degrees of polarization of the P-polarized light component in the first and second polarization states, respectively, which are derived theoretically or experimentally by changing the setting of the illumination optical system 104, and C and D are coefficients which satisfy equations (6) and (7) in the first and second polarization states, respectively.

The degree of polarization Pout to measure and control the degree of polarization of the P-polarized light component may be derived periodically or while change in the polarization state or illumination state of the exposure light has no adverse influence on the throughput, for example, during apparatus maintenance.

The coefficients E and F used to obtain the degree of polarization Sout of the S-polarized light component can be derived using equations equivalent to equations (6) and (7). Although a detailed description of this derivation will not be given, the coefficients E and F can be derived by substituting the values for the S-polarized light component in these equations for those for the P-polarized light component, that is, by changing the coefficients C and D to the coefficients E and F, respectively, and the degrees of polarizations Pout_base and Pout_rot to the degrees of polarizations Sout_base and Sout_rot, respectively.

Figure 3:
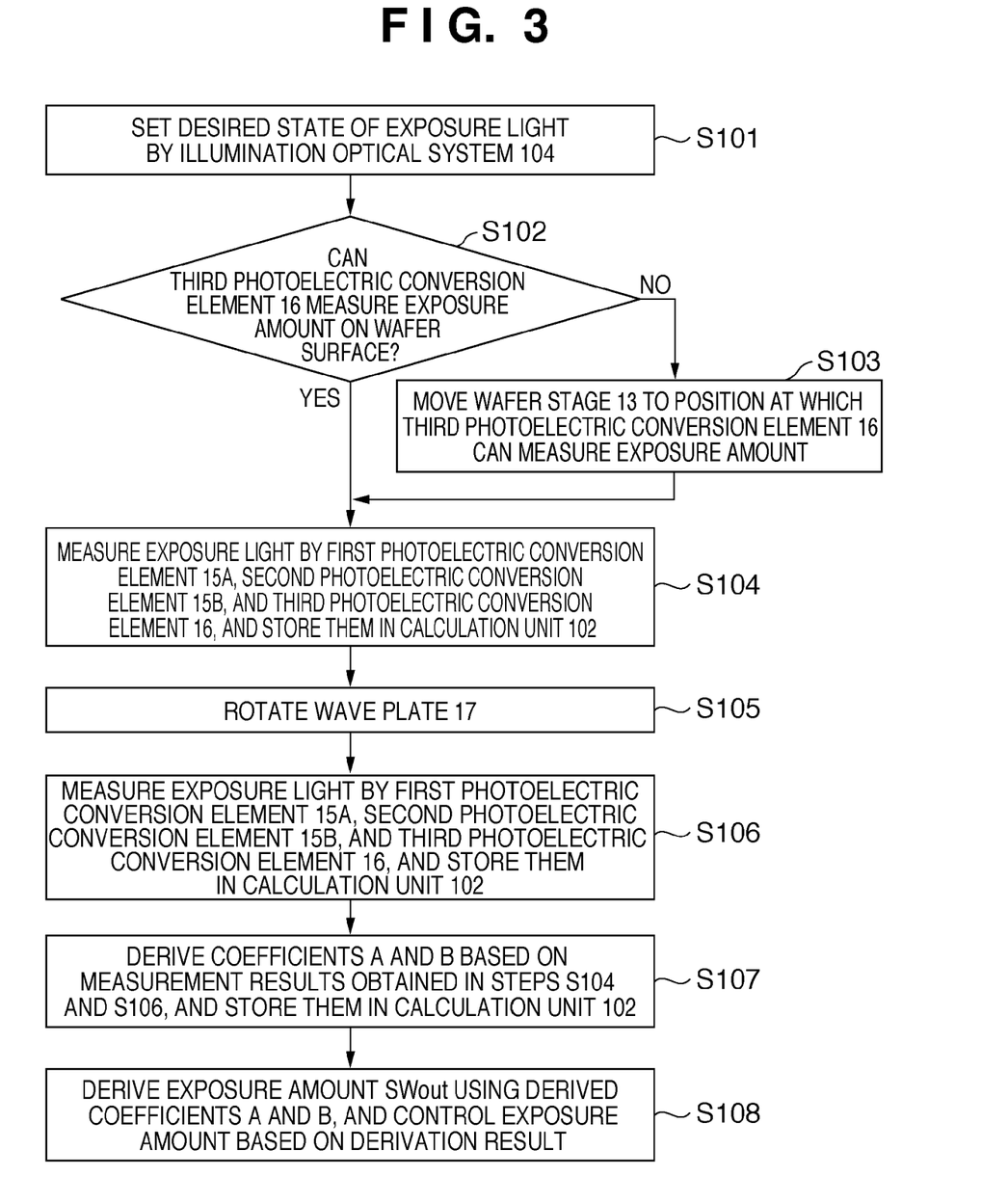
FIG. 3 is a flowchart illustrating an example of the sequence of the method of controlling the exposure amount.

FIG. 3 is a flowchart illustrating an example of a sequence for deriving the coefficients A and B and exposure amount SWout to control the exposure amount. The controller 100 drives the illumination optical system 104 to set a desired polarization state and illumination state (S101). The controller 100 confirms whether the third photoelectric conversion element 16 lies at a position at which measurement of the exposure amount on the exposure target surface of the wafer 12 is possible (S102). If the third photoelectric conversion element 16 lies at a position at which measurement is impossible, the scan controller 101 moves the wafer stage 13 to set a state in which the third photoelectric conversion element 16 can measure the exposure amount (S103). The controller 100 controls the first photoelectric conversion element 15A, second photoelectric conversion element 15B, and third photoelectric conversion element 16 to detect the exposure light, and controls the calculation unit 102 to store the detection values obtained by them (S104). The controller 100 rotates the wave plate 17 to change the polarization state of the exposure light (S105). The controller 100 controls the first photoelectric conversion element 15A, second photoelectric conversion element 15B, and third photoelectric conversion element 16 to detect the exposure light again, and controls the calculation unit 102 to store the detection values obtained by them, as in step S104 (S106). The calculation unit 102 derives coefficients A and B based on the detection results obtained in steps S104 and S106, and stores them (S107). The calculation unit 102 derives an exposure amount SWout using the coefficients A and B derived in step S107, and the controller 100 controls the exposure amount based on the derivation result (S108).

Figure 4:
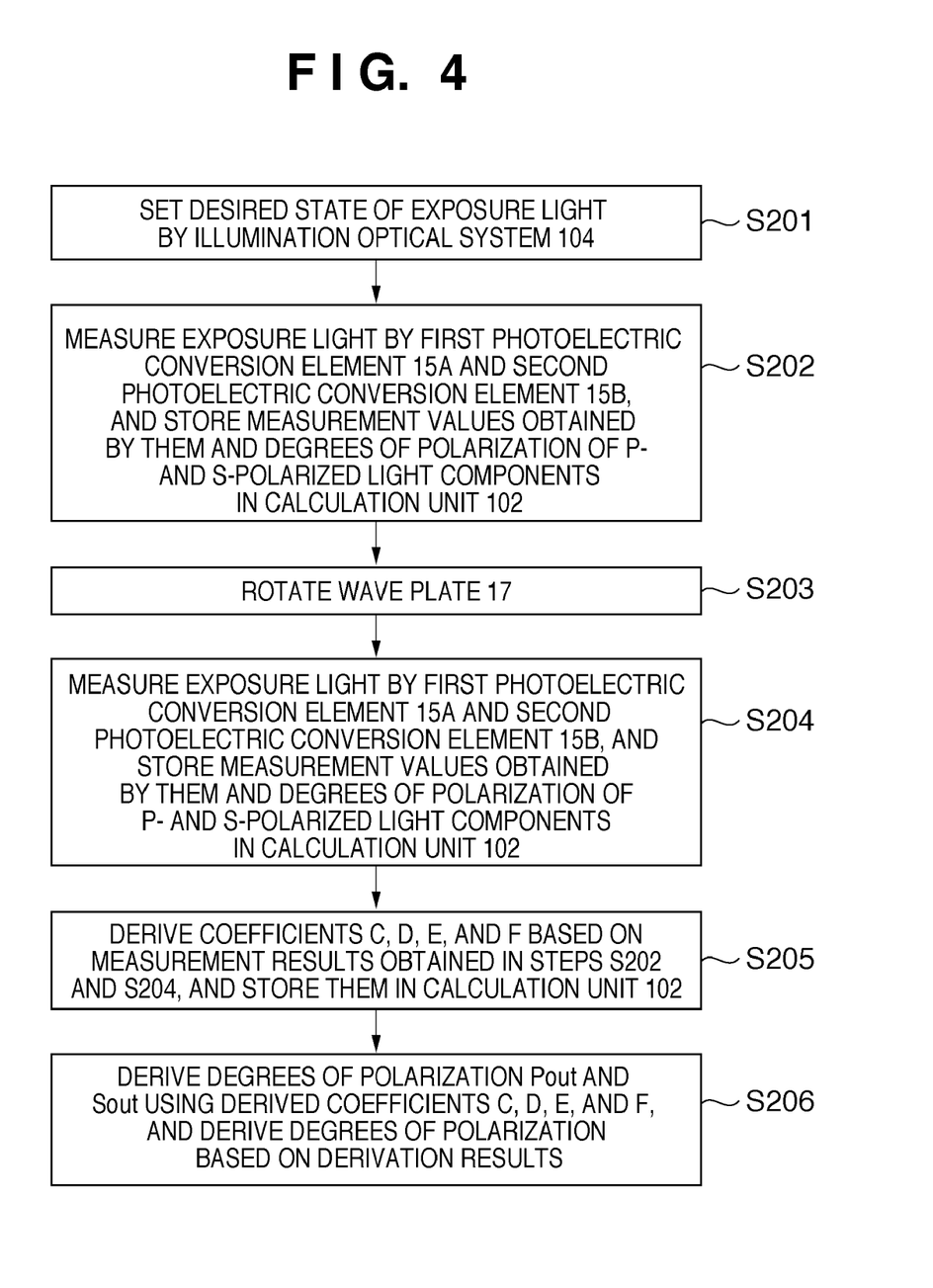
FIG. 4 is a flowchart illustrating an example of the sequence of the method of controlling the degrees of polarization of P- and S-polarized light components.

FIG. 4 is a flowchart illustrating an example of a sequence for measuring and controlling the degrees of polarization Pout and Sout of the P- and S-polarized light components, respectively. The controller 100 drives the illumination optical system 104 to set a desired polarization state and illumination state (S201). The controller 100 controls the first photoelectric conversion element 15A and second photoelectric conversion element 15B to detect the exposure light, and controls the calculation unit 102 to store the detection values obtained by them and degrees of polarizations Pout_base and Sout_base of the P- and S-polarized light components, respectively (S202). The degrees of polarization Pout_base and Sout_base of the P- and S-polarized light components, respectively, are values derived theoretically or experimentally. The controller 100 rotates the wave plate 17 to change the polarization state of the exposure light (S203). The controller 100 controls the first photoelectric conversion element 15A and second photoelectric conversion element 15B to detect the exposure light again, and controls the calculation unit 102 to store the detection values obtained by them and degrees of polarization Pout_rot and Sout_rot of the P- and S-polarized light components, respectively, as in step S202 (S204). The degrees of polarization Pout_rot and Sout_rot of the P- and S-polarized light components, respectively, are values derived theoretically or experimentally, as in step S202. The calculation unit 102 derives coefficients C, D, E, and F based on the measurement results obtained in steps S202 and S204, and stores them (S205). The calculation unit 102 derives degrees of polarization Pout and Sout of the P- and S-polarized light components using the coefficients C, D, E, and F derived in step S205, and the controller 100 controls the degrees of polarization based on the derivation results (S206).

According to this embodiment, it is possible to acquire coefficients necessary to control the exposure amount and the degrees of polarization without using the second light beam dividing unit, unlike the prior art disclosed in Japanese Patent Laid-Open No. 2002-198281. This makes it possible to accurately control the exposure amount using a low-cost, compact detection unit.

Second Embodiment

Figure 5:
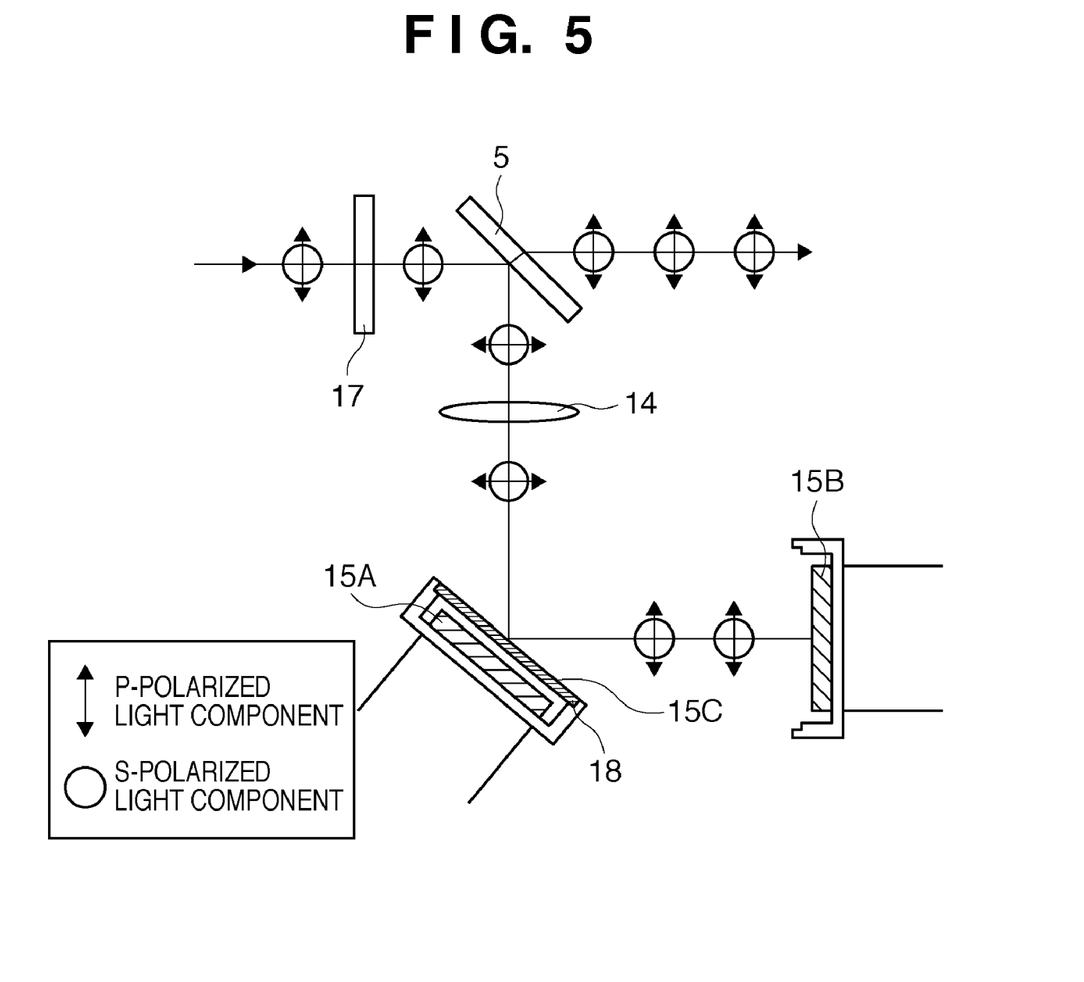
FIG. 5 is a view showing methods of controlling the exposure amount and the degrees of polarization of P- and S-polarized light components using a first photoelectric conversion element, light beam dividing units, and a second photoelectric conversion element according to the second embodiment.

The second embodiment of the present invention will be explained next. FIG. 5 is a view showing details of another detection unit 15. A light beam containing P- and S-polarized light components is divided by a first light beam dividing unit 5 via a wave plate 17. The bifurcated light beam is received by a second light beam dividing unit 18, arranged adjacent to a first photoelectric conversion element 15A, via a lens 14. The surface of the second light beam dividing unit 18 set on the side of an illumination optical system 104 serves as a light dividing surface 15C which divides the light beam bifurcated by the illumination optical system 104 into transmitted light and reflected light. The light transmitted through the light dividing surface 15C is received by the first photoelectric conversion element 15A. The holding configuration of the second light beam dividing unit 18 arranged near the first photoelectric conversion element 15A will be described later. The light reflected by the light dividing surface 15C corresponding to the surface of the second light beam dividing unit 18 arranged near the first photoelectric conversion element 15A is received by a second photoelectric conversion element 15B. The sensitivity of each photoelectric conversion element is desirably calibrated in advance.

Figure 6:
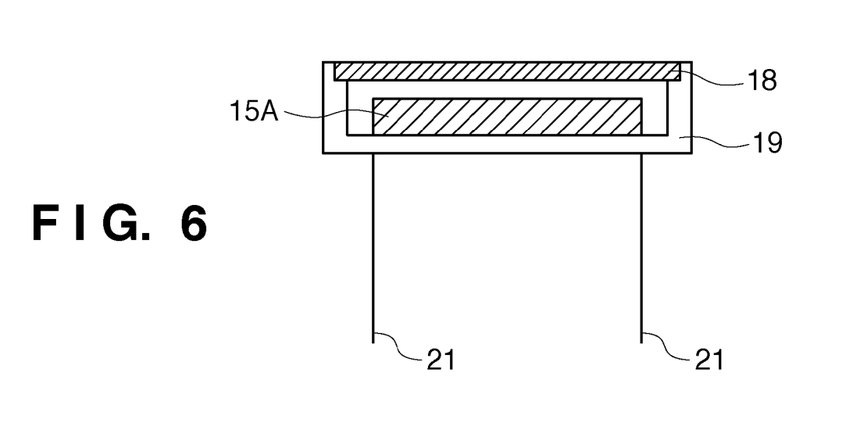
FIG. 6 is a view showing an example of the arrangement of the first photoelectric conversion element and second light beam dividing unit according to the second embodiment.
Figure 7:
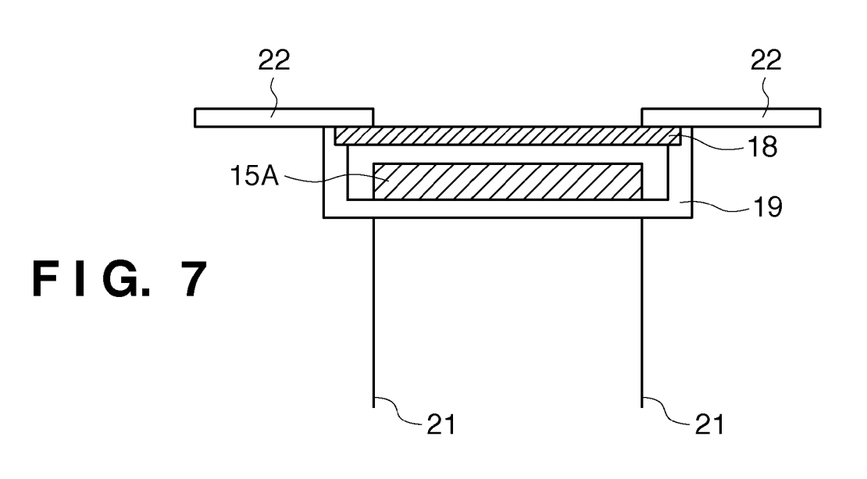
FIG. 7 is a view showing another example of the arrangement of the first photoelectric conversion element and second light beam dividing unit according to the second embodiment.
Figure 8:
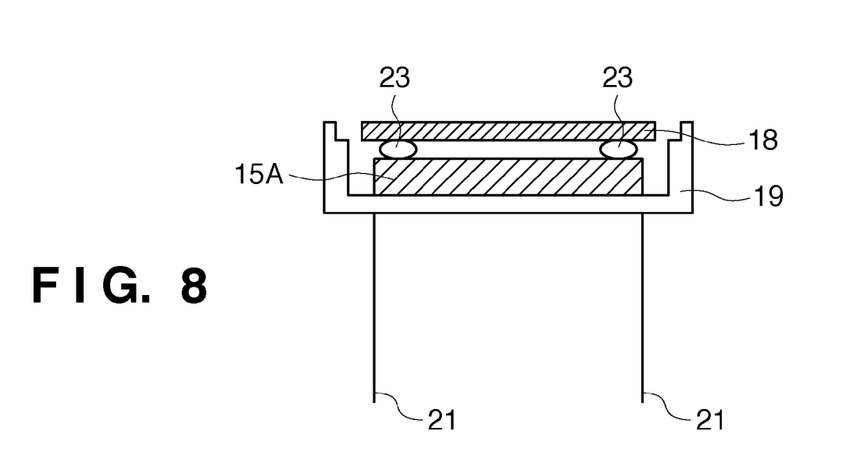
FIG. 8 is a view showing still another example of the arrangement of the first photoelectric conversion element and second light beam dividing unit according to the second embodiment.

The accuracy of calculating coefficients A, B, C, D, E, and F is highest when the first photoelectric conversion element 15A measures only the P-polarized light component, and the second photoelectric conversion element 15B detects only the S-polarized light component. In the first embodiment, it is difficult to optimize the coefficient calculation accuracy because reflection by the light dividing surface 15C corresponding to the surface of the first photoelectric conversion element 15A is used. In contrast, in the second embodiment, the ratios of transmission and reflection between the P- and S-polarized light components can be easily adjusted because the second light beam dividing unit 18 is used. This makes it possible to increase the coefficient calculation accuracy from that in the first embodiment. In order to reduce the overall size of the first photoelectric conversion element 15A, second photoelectric conversion element 15B, and second light beam dividing unit 18, the second light beam dividing unit 18 is desirably integrated with the first photoelectric conversion element 15A. FIGS. 6 to 8 show details of the integration method.

A schematic view of the entire scanning projection exposure apparatus, a method of measuring and controlling the exposure amount, a method of measuring and controlling the degrees of polarization of P- and S-polarized light components, and flowcharts illustrating an example of their sequences are the same as in the first embodiment, and a description thereof will not be given.

FIG. 6 is a view showing an example when the second light beam dividing unit 18 is arranged adjacent to the first photoelectric conversion element 15A. The first photoelectric conversion element 15A can convert the incident light beam into an electrical signal, and output the electrical signal from an electrode portion 21. The second light beam dividing unit 18 can be arranged adjacent to the first photoelectric conversion element 15A by being bonded and fixed onto a holding unit 19 which holds the first photoelectric conversion element 15A. Unlike the conventional arrangement in which the second light beam dividing unit 18 is arranged independently of the first photoelectric conversion element 15A, they are integrated with each other in this embodiment. This makes it possible to downsize the detection unit 15, thus reducing its accommodation space.

FIG. 7 is a view showing another example when the second light beam dividing unit 18 is arranged adjacent to the first photoelectric conversion element 15A. The first photoelectric conversion element 15A can convert the incident light beam into an electrical signal, and output the electrical signal from an electrode portion 21. The second light beam dividing unit 18 can be arranged adjacent to the first photoelectric conversion element 15A by being mounted at the edges of a holding unit 19 which holds the first photoelectric conversion element 15A, and being attached by pressure and fixed onto a holding unit 22 for the second light beam dividing unit.

FIG. 8 is a view showing still another example when the second light beam dividing unit 18 is arranged adjacent to the first photoelectric conversion element 15A. The first photoelectric conversion element 15A can convert the incident light beam into an electrical signal, and output the electrical signal from an electrode portion 21. The second light beam dividing unit 18 can be arranged adjacent to the first photoelectric conversion element 15A by being bonded and fixed onto the first photoelectric conversion element 15A through bumps 23.

Third Embodiment

Figure 9A:
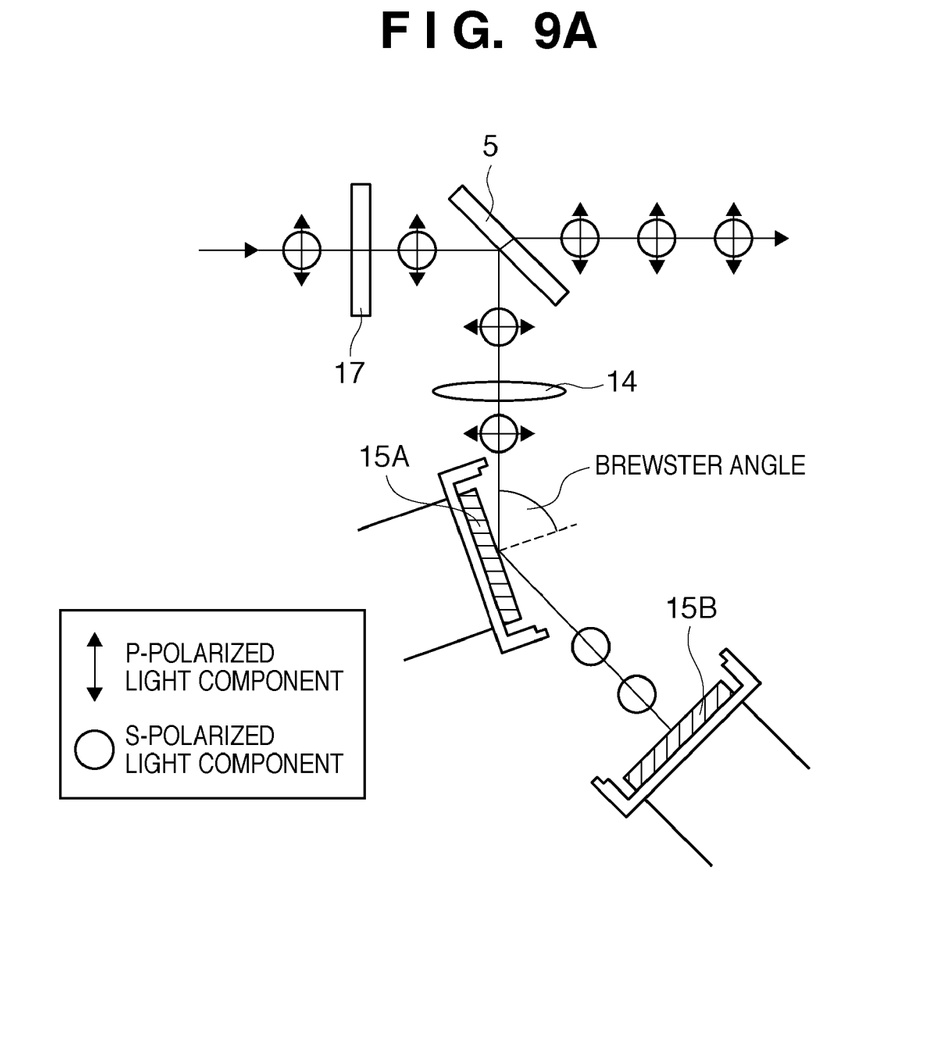
FIG. 9A is a view showing methods of controlling the exposure amount and the degrees of polarization of P- and S-polarized light components using a first photoelectric conversion element and second photoelectric conversion element according to the third embodiment.

The third embodiment of the present invention will be explained with reference to FIGS. 9A and 9B next. Referring to FIG. 9A, a light beam containing P- and S-polarized light components is divided by a first light beam dividing unit 5 via a wave plate 17, and received by a first photoelectric conversion element 15A via a lens 14. The light reflected by a light dividing surface 15C corresponding to the surface of the first photoelectric conversion element 15A is received by a second photoelectric conversion element 15B. At this time, to improve the transmittance ratio between the P- and S-polarized light components, the incident angle of the light beam with respect to the light dividing surface 15C corresponding to the surface of the first photoelectric conversion element 15A is set nearly equal to the Brewster angle.

Figure 9B:
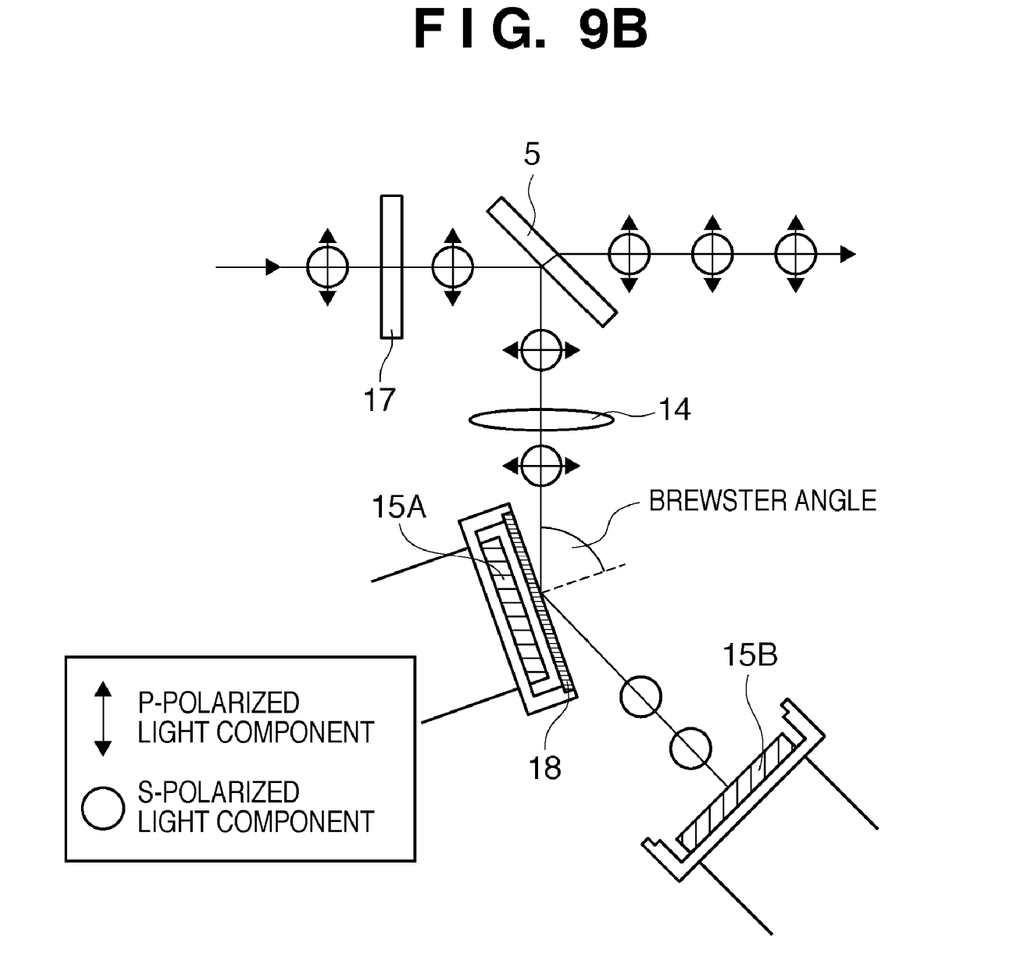
FIG. 9B is a view showing methods of controlling the exposure amount and the degrees of polarization of P- and S-polarized light components using the first photoelectric conversion element, a second light beam dividing unit, and the second photoelectric conversion element according to the third embodiment.

Referring to FIG. 9B, a light beam containing P- and S-polarized light components is divided by a first light beam dividing unit 5 via a wave plate 17, and received by a first photoelectric conversion element 15A via a lens 14 and a second light beam dividing unit 18 arranged adjacent to the first photoelectric conversion element 15A. The light reflected by the second light beam dividing unit 18 arranged adjacent to the first photoelectric conversion element 15A is received by a second photoelectric conversion element 15B. At this time, to improve the transmittance ratio between the P- and S-polarized light components, the incident angle of the light beam with respect to the second light beam dividing unit 18 is set nearly equal to the Brewster angle.

In the first and second embodiments, it is difficult to independently measure the P- and S-polarized light components from the viewpoint of the properties of the first photoelectric conversion element 15A and second light beam dividing unit 18. In contrast, in the third embodiment, the P- and S-polarized light components can be independently measured by improving their transmittance ratio. This makes it possible to measure and control the exposure amount and the degrees of polarization with high accuracy because the accuracy of deriving coefficients A, B, C, D, E, and F is higher than those in the first and second embodiments.

A schematic view of the entire scanning projection exposure apparatus, a method of measuring and controlling the exposure amount, a method of measuring and controlling the degrees of polarization of P- and S-polarized light components, and flowcharts illustrating an example of their sequences are the same as in the first embodiment, and a description thereof will not be given.

The above-mentioned first to third embodiments can also be exploited for an immersion projection exposure apparatus in which the space between a projection optical system 11 and a wafer 12 is filled with a medium. Also, the above-mentioned first to third embodiments can be practiced to control the exposure amount even when the P- and S-polarized light components shown in FIGS. 2, 5, 9A, and 9B, which are received by the first photoelectric conversion element 15A and second photoelectric conversion element 15B, are reversed.

[Application to Method of Manufacturing Device]

A method of manufacturing devices (for example, a semiconductor IC device and a liquid crystal display device) using the above-described exposure apparatus will be explained next. Devices are manufactured by a step of exposing a substrate (for example, a wafer or glass substrate) coated with a photosensitive agent to radiant energy using the exposure apparatus according to the above-described embodiments, a step of developing the exposed substrate (photosensitive agent), and other known steps (for example, etching, resist removal, dicing, bonding, and packaging steps). This method can manufacture devices with a quality higher than that of the conventional devices. In this manner, a method of manufacturing a device using an exposure apparatus and the resultant device constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-048824, filed Feb. 28, 2008, which is hereby incorporated by reference herein in its entirety.

What is claimed is:

1. An exposure apparatus including an illumination optical system which illuminates an original with light emitted by a light source, and a projection optical system which projects a pattern image of the original illuminated by the illumination optical system onto a substrate, the apparatus comprising:
    a light dividing surface which reflects a certain component of the light beam bifurcated by the illumination optical system, and transmits the remaining component of the light beam;
    a first photoelectric conversion element which detects the light beam transmitted through said light dividing surface;
    a second photoelectric conversion element which detects the light beam reflected by said light dividing surface; and
    a controller which controls the light beam which becomes incident on the substrate, using the outputs from said first photoelectric conversion element and said second photoelectric conversion element while the light emitted by the light source is in a first polarization state, and the outputs from said first photoelectric conversion element and said second photoelectric conversion element while the light emitted by the light source is in a second polarization state different from the first polarization state,
    wherein said light dividing surface is a surface of a member of said first photoelectric conversion element, which is set on a side of the illumination optical system.

2. An exposure apparatus including an illumination optical system which illuminates an original with light emitted by a light source, and a projection optical system which projects a pattern image of the original illuminated by the illumination optical system onto a substrate, the apparatus comprising:
    a light dividing surface which reflects a certain component of the light beam bifurcated by the illumination optical system, and transmits the remaining component of the light beam;
    a first photoelectric conversion element which detects the light beam transmitted through said light dividing surface;

a second photoelectric conversion element which detects the light beam reflected by said light dividing surface; and a controller which controls the light beam which becomes incident on the substrate, using the outputs from said first photoelectric conversion element and said second photoelectric conversion element while the light emitted by the light source is in a first polarization state, and the outputs from said first photoelectric conversion element and said second photoelectric conversion element while the light emitted by the light source is in a second polarization state different from the first polarization state, wherein said light dividing surface is a surface, on a side of the illumination optical system, of a light beam dividing unit which divides the light beam bifurcated by the illumination optical system into transmitted light and reflected light, wherein said first photoelectric conversion element and said light beam dividing unit are integrated with each other, wherein said light beam dividing unit is held by said first photoelectric conversion element through a bump.

* * * * *